METHOD OF MANUFACTURING PHOTO-ELECTRIC SEMI-CONDUCTOR DEVICES

Filed Sept. 20, 1961

INVENTOR
CLAUDE BEAUZÉE
BY Frank R. Jeffari
AGENT

United States Patent Office 3,261,074

Patented July 19, 1966

3,261,074

METHOD OF MANUFACTURING PHOTO-ELECTRIC SEMI-CONDUCTOR DEVICES

Claude Beauzée, Paris, France, assignor to North American Philips Company, Inc., New York, N.Y., a corporation of Delaware Filed Sept. 20, 1961, Ser. No. 139,455
Claims priority, application France, Oct. 11, 1960, 840,830
2 Claims. (Cl. 29—25.3)

This invention relates to methods of manufacturing photo-electric semi-conductor devices comprising a semi-conductor body having a surface layer of a given conductivity type and an underlying part of opposite conductivity type. Such a body shows a photo-electric effect when light is projected onto its surface layer and is thus serviceable more particularly as a photo-electric cell for detecting light or as a so-called solar cell for generating current from sunlight. The said bodies may also be used, however, for manufacturing diodes, transistors or other semi-conductor devices.

A surface layer of a conductivity type opposite to that of the underlying part of the semi-conductor body may be manufactured, for example, by diffusing or alloying given significant impurities into or onto the body. Thereafter it is often desirable to decrease the thickness of the layer to a given extent, which may be effected, for example, by chemical agency in the form of etching or by mechanical means in the form of a grinding operation.

An object of the invention is inter alia to provide a method for obtaining semi-conductor devices having a very high output, that is to say devices in which a very high ratio exists between the electrical energy generated and the amount of light received.

The invention is based inter alia on the recognition that, on the one hand, the surface layer must be very thin in order to avoid light absorption and also to decrease recombination of pairs of electron holes generated by the light and that, on the other hand, the layer must not be so thin that its electrical impedance becomes so high as to detrimentally affect the output.

According to the invention the surface layer, after this layer and the underlying part have been provided with contacts and connected to a measuring instrument, is subjected to an irradiation with light and to a treatment for removal of material during which treatment the output is measured, the treatment being terminated while measuring the output since the output is a measure of the thickness of the layer which can readily be determined empirically.

The treatment for removal of material is preferably not terminated before the differential quotient of the variation in output and the decrease in thickness has reached its maximum value.

In this connection it is mentioned that, as will be described in detail hereinafter, the output initially increases during the said treatment. The increase per second during the beginning of the treatment has likewise an increasing value. However, the increase per second reaches a maximum shortly before the output has reached its maximum value assuming that the decrease in thickness per second is constant.

The treatment for removal of material is preferably terminated when the output has reached its maximum.

The invention also relates to a photo-electric semi-conductor device manufactured by using one of said methods.

The semi-conductor device may be characterized in that the surface layer is so thin that the differential quotient of the variation in output and the decrease in thickness becomes smaller but is positive when the thickness of the layer decreases further.

It is to be noted that the invention distinguishes itself from a known method in which a semi-conductor body is etched to a given thickness by passing light through the body and measuring the intensity of the light during etching. In the known method the treated body is homogeneous, and an increase in the photo-electric output of a surface layer, on the one hand, and a decrease in the conductivity of this layer, on the other hand, serving as a criterion for terminating the etching process are disregarded.

In order that the invention may be readily carried into effect, one embodiment thereof will now be described in detail, by way of example, with reference to the accompanying diagrammatic drawing, in which.

Figure 1:
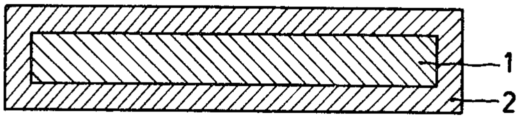
FIGURES 1 to 3 show sections of a semi-conductor device in preparative stages of manufacture.

The initial product employed is, for example, a p-type silicon disc 1 of 20 mms. in diameter and 50 microns thick, an amount of gallium being added to the silicon such that the specific resistance is 1 ohm-cm. By means of a diffusion treatment in a phosphor-containing atmosphere at 1100° C. for 1 hour, a surface layer 2 completely covering the disc 1 was converted into n-type conductivity up to a depth of about 5 microns (see FIGURE 1).

Figure 2:
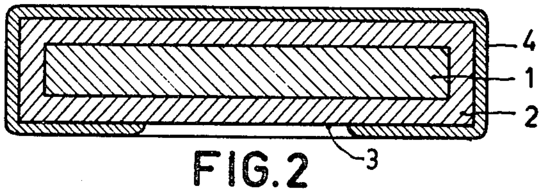

The disc 1, except a portion 3 at the underside (see FIGURE 2), was subsequently covered with a masking layer 4, for example of bees wax. In a bath (not shown) composed of 20 ccm. of HF (50%) and 0.5 ccm. of fuming $HNO_3$, the portion 3 was then removed from the underside by etching to a depth such that a part of the p-type bulk located beneath the surface layer was reached.

Figure 3:
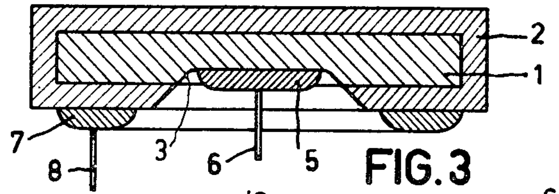

FIGURE 3 shows the device after the masking layer 4 was removed and a contact 5 consisting of silver and 2% of aluminum and a supply conductor 6 were provided on the portion 3 treated by etching and also a contact 7 consisting of pure silver and a supply conductor 8 were soldered to the portion of the underside not attacked by etching.

Figure 4:
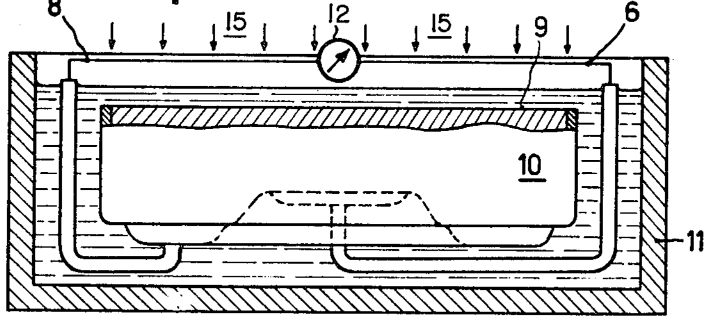
FIGURE 4 shows such a device in an etching bath.

Subsequently the whole device, except the upper surface 9, was again covered with a masking layer 10 and introduced into an etching bath 11, as shown in FIGURE 4. The etching means may be of the same composition as mentioned hereinbefore. The output of the photo-electric semi-conductor device may now be measured by impinging light 15 onto the upper surface 9 and connecting the supply conductors 6 and 8 to a measuring instrument 12, e.g., an ammeter.

Figure 5:
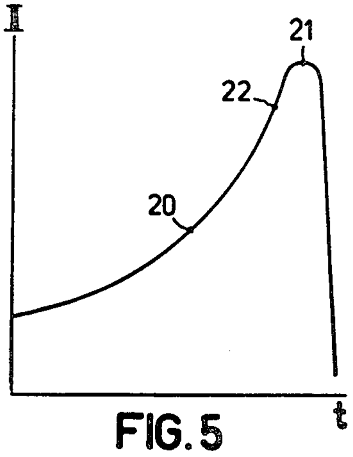
FIGURE 5 shows the variation in output during etching.

FIGURE 5 shows the variation of this short circuit current I through the ammeter 12 which with constant illumination may be regarded as a measure of the output, as a function of the duration $t$ of the etching process. Assuming the decrease in thickness per second of the part of the layer exposed to the etching bath to be constant, the duration $t$ may also be regarded as a measure of the decrease in thickness.

As appears from curve 20 in FIGURE 5 the output initially increases to a maximum as indicated by 21, and then rapidly drops to zero. The initial increase may be attributable inter alia to a decrease of the light absorption in the thinning layer 2 and to a reduced recombination of the pairs of electron holes produced by the light in said layer. The rapid fall of the output after the moment determined by point 21 is caused inter alia by the rapid increase of the resistance encountered by the current I in layer 2.

The relationship of the output of a given type of a semiconductor device with the thickness of layer 2 may be determined empirically. The output measured may then serve as a criterion for terminating the etching process when a semi-conductor device with surface layer 2 of a given thickness is desired.

From FIGURE 5 it also appears that the differential quotient of the variation in output and the decrease in thickness, that is to say the slope of curve 20, initially increases and reaches its maximum value at the bending point 22. The etching process is preferably not terminated before this value for the output is reached. After this value has been reached, the output increases still further, although the said differential quotient, that is to say the slope of the curve, decreases. The etching process is preferably terminated when the maximum indicated by point 21 is reached.

The described method is fundamentally independent of the semi-conductive material of which the device is made. The treatment for removal of material may be an etching treatment, but the material located at the surface may alternatively be removed by grinding, sandblasting, by bombardment by electrons or by means of an electrolytic treatment. Insofar as such material-removing treatments could affect the measurement of output because of the currents or voltages occurring therein, the said treatment and output measurement may also be carried out intermittently with rapid alternation. Since such methods yield the same result as shown in FIGURE 5, they are regarded as taking place substantially at the same time.

Figure 6:
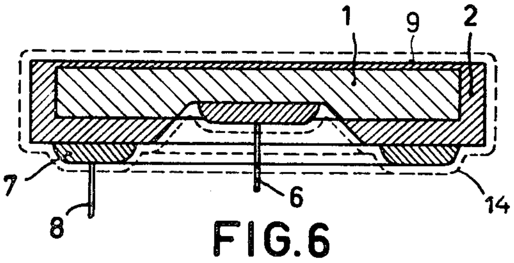
FIGURE 6 is a sectional view of a finished semi-conductor device.

The device shown in FIGURE 4 may eventually be dried and deprived of its masking layer 10. In order to protect the surface against atmospheric influences, it may eventually be covered with a lacquer layer 14 as shown in broken line in FIGURE 6.

Although the invention is primarily intended to permit the manufacture of photo-electric semi-conductor devices having a high photo-electric output, it is also applicable to the manufacture of semi-conductor bodies having a surface layer of a small thickness capable of being accurately determined, which bodies may be used in diodes, transistors or similar devices.

What is claimed is:

1. A method of manufacturing a semiconductor device utilizing a semiconductive body exhibiting photoelectric properties, comprising the steps of providing said semiconductive body with a surface layer of one conductivity type forming a junction with a bulk portion of the opposite conductivity type and providing contacts to said surface layer and said bulk portion, irradiating with light the said body at said surface layer, while so irradiating measuring the light generated electrical current output of said body across the contacts thereto and subjecting the said surface layer to a material-removal by etching operation reducing the layer thickness and causing the measured electrical output to increase, and terminating the material-removal operation not before the relative measured electrical output change with time reaches its maximum value but before the absolute output substantially declines.

2. A method as set forth in claim 1 wherein the material-removal operation is terminated when the measured output reaches its maximum value.

References Cited by the Examiner

UNITED STATES PATENTS

| | | | |
|---|---|---|---|
| 1,904,895 | 4/1933 | Campbell | 316—5 |
| 2,794,846 | 6/1957 | Fuller | 136—89 |
| 2,915,578 | 12/1959 | Pensak | 136—89 |
| 2,929,859 | 3/1960 | Lofershi | 136—89 |
| 3,039,896 | 6/1962 | Van Cakenberghe | 136—89 X |

JOHN F. CAMPBELL, *Primary Examiner.*

JOHN H. MACK, WHITMORE A. WILTZ, *Examiners.*

J. H. BARNEY, W. I. BROOKS, *Assistant Examiners.*